US009053651B2

(12) United States Patent
Yeo et al.

(10) Patent No.: US 9,053,651 B2
(45) Date of Patent: Jun. 9, 2015

(54) FLEXIBLE DISPLAY DEVICE

(71) Applicant: Samsung Display Co., Ltd., Yongin, Gyeonggi-Do (KR)

(72) Inventors: Yong-Seok Yeo, Yongin (KR); Kee-Han Uh, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/927,318

(22) Filed: Jun. 26, 2013

(65) Prior Publication Data
US 2013/0286462 A1 Oct. 31, 2013

(30) Foreign Application Priority Data
Feb. 13, 2013 (KR) .................. 10-2013-0015532

(51) Int. Cl.
| G02B 26/00 | (2006.01) |
| G02F 1/03 | (2006.01) |
| G06F 3/041 | (2006.01) |
| G09G 5/00 | (2006.01) |
| H01L 27/32 | (2006.01) |
| G02F 1/00 | (2006.01) |
| G06F 3/01 | (2006.01) |
| H01L 51/00 | (2006.01) |

(52) U.S. Cl.
CPC .. *G09G 5/00* (2013.01); *G02F 1/03* (2013.01); *G06F 3/041* (2013.01); *H01L 27/32* (2013.01); *H01L 27/3241* (2013.01); *G02F 1/0018* (2013.01); *G06F 3/016* (2013.01); *H01L 51/0097* (2013.01); *H01L 27/3244* (2013.01); *H01L 2251/5338* (2013.01); *G09G 2380/02* (2013.01); *H01L 2251/308* (2013.01); *H01L 27/3225* (2013.01)

(58) Field of Classification Search
CPC .......... G02B 26/00; G02B 26/02; G02F 1/00; G02F 1/0009; G02F 1/0018; G02F 1/03; G09G 3/0006; G09G 3/0056; G09G 3/0043; G09G 3/32; G09G 3/34; G09G 5/00; H01L 27/32; H01L 27/3241; H01L 27/3244; H01L 41/083; H01L 41/0926; H01L 41/193; H01L 51/0097; H01L 51/5036; H01L 2251/308; H01L 2251/5338; G06F 3/016; G06F 3/041
USPC ............. 359/290–295, 245; 345/88, 167, 690
See application file for complete search history.

(56) References Cited

U.S. PATENT DOCUMENTS 7,449,818 B2 * 11/2008 Kato et al. .................... 310/331
7,456,823 B2 * 11/2008 Poupyrev et al. ............. 345/173
(Continued)

FOREIGN PATENT DOCUMENTS

| JP | 2003-280546 A | 10/2003 |
| KR | 10-2010-0031027 A | 3/2010 |
| KR | 10-2011-0097708 A | 8/2011 |

*Primary Examiner* — Loha Ben
(74) *Attorney, Agent, or Firm* — Robert E. Bushnell, Esq.

(57) ABSTRACT

Provided is a flexible display device including a display body having flexibility; an actuator for changing and driving the display body; and an initial shape forming substrate for maintaining an initial state of the display body before the display body is changed and driven. The flexible display device allows a user to exactly control a change state of the flexible display device by driving the actuator and to decrease power consumption for changing and driving the flexible display device. Thus, by using the flexible display device, user convenience can be improved and the flexible display device can be driven with low power consumption.

10 Claims, 4 Drawing Sheets

(56) References Cited

U.S. PATENT DOCUMENTS

| | | | |
|---|---|---|---|
| 7,692,361 B2* | 4/2010 | Kato et al. | 310/328 |
| 2010/0026952 A1* | 2/2010 | Miura et al. | 349/150 |
| 2012/0113480 A1 | 5/2012 | Mochizuki et al. | |
| 2012/0133690 A1* | 5/2012 | Katayama | 345/690 |
| 2012/0312585 A1 | 12/2012 | Baek et al. | |

* cited by examiner

FLEXIBLE DISPLAY DEVICE

CROSS-REFERENCE TO RELATED PATENT APPLICATION

This application claims the benefit of Korean Patent Application No. 10-2013-0015532, filed on Feb. 13, 2013, in the Korean Intellectual Property Office, the disclosure of which is incorporated herein in its entirety by reference.

BACKGROUND OF THE INVENTION

1. Field of the Invention

The present invention relates to a flexible display device, and more particularly, to a flexible display device that is improved to control a physical change of the flexible display device.

2. Description of the Related Art

In general, a flexible display device indicates a device that has flexibility by having a display unit formed on a flexible substrate such as polyimide. The flexible display device is very convenient since a shape of the flexible display device can be changed to reduce its size for portability.

However, until now, there is no means of exactly controlling a physical change of the flexible display device. In this regard, since a user has to roughly fold or unfold the flexible display device, when the user reduces the size of the flexible display device so as to carry it, it is difficult for the user to exactly change the shape into a reduced shape, and when the user unfolds the flexible display device so as to watch a screen, it is difficult for the user to exactly change the shape into a flat shape.

Thus, in order to solve these inconveniences, there is a demand for a flexible display device having a new structure by which a change state of the flexible display device can be exactly controlled.

SUMMARY OF THE INVENTION

The present invention provides a flexible display device that is improved to exactly control a change state of the flexible display device and to decrease power consumption for changing and driving the flexible display device.

According to an aspect of the present invention, there is provided a flexible display device including a display body having flexibility; an actuator for changing and driving the display body; and an initial shape forming substrate for maintaining an initial state of the display body before the display body is changed and driven.

The actuator may include a first electrode and a second electrode which face each other, and an electro-active polymer layer that is interposed between the first electrode and the second electrode.

When a voltage is applied to the first electrode and the second electrode, the electro-active polymer layer may extend whereby the flexible display device may be changed.

The electro-active polymer layer may include polyvinylidene fluoride (PVDF), polydimethyl siloxane (PDMS), or polyvinylidene fluoride-co-trifluoroethylene (PVFT).

The first electrode and the second electrode may include an indium tin oxide (ITO) material.

The actuator may be formed of one basic unit in which the electro-active polymer layer is interposed between the first electrode and the second electrode.

The actuator may have a structure in which a plurality of basic units are stacked, wherein the electro-active polymer layer is interposed between the first electrode and the second electrode in each of the plurality of basic units.

The initial shape forming substrate may maintain the initial state of the display body as a folding state, and when the actuator is driven, the display body may be turned into a flat state.

The initial shape forming substrate may be formed of an alloy material including at least one of magnesium, aluminum, and lead.

The display body may be attached to one surface of the initial shape forming substrate, and the actuator may be attached to another surface of the initial shape forming substrate.

The display body may be attached to one surface of the actuator, and the initial shape forming substrate may be attached to another surface of the actuator.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining exemplary embodiments of the invention with reference to the attached drawings.

Figure 1:
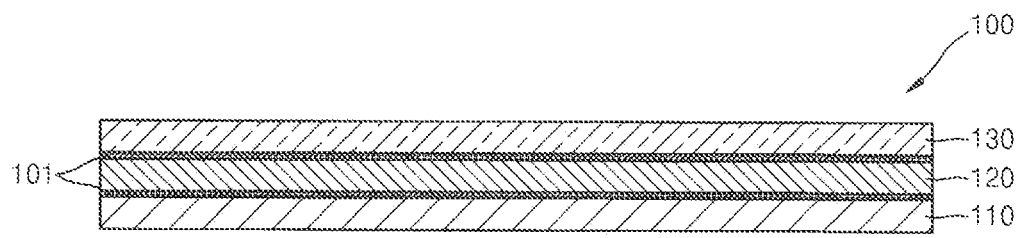
FIG. 1 illustrates a flexible display device according to an embodiment of the present invention.

FIG. 1 illustrates a flexible display device 100 according to an embodiment of the present invention.

As illustrated in FIG. 1, the flexible display device 100 includes a display body 130 having flexibility, an initial shape forming substrate 120 that is attached on one surface of the display body 130, and an actuator 110 that is attached on another surface of the initial shape forming substrate 120. In FIG. 1, a reference numeral 101 indicates an adhesive layer.

The display body 130 indicates a structure which includes a thin-film transistor (TFT) and a light-emitting device to realize an image, and an encapsulation layer to cover and protect the TFT and the light-emitting device that are stacked on a flexible substrate. Hereinafter, the structure is simply referred to as the display body 130. Since the display body 130 uses the flexible substrate, instead of a solid glass substrate, the display body 130 may be freely bent to the extent of the maximal flexibility of the display body 130.

Figure 2:
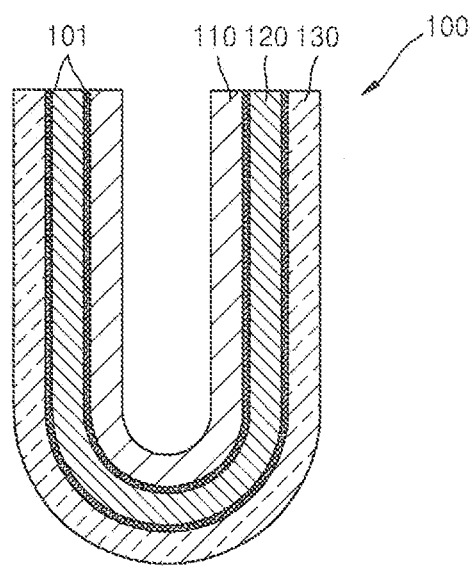
FIG. 2 illustrates an initial state of the flexible display device of FIG. 1 before the flexible display device is driven.

The initial shape forming substrate 120 is formed by casting an alloy of magnesium, aluminum, lead, or the like having a low elasticity modulus in a die, and functions to maintain an initial state of the flexible display device 100 as a folding state as shown in FIG. 2. That is, the initial shape forming substrate 120 is formed to the folding state of a U-shape via the casting, and maintains the folding state unless an external force is applied in an opposite direction. Thus, the display body 130 that is combined with the initial shape forming substrate 120 maintains a folding state when it is not used.

Figure 4A:
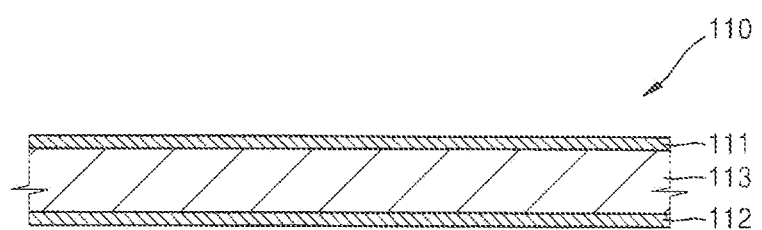
FIG. 4A illustrates a structure of an actuator of the flexible display device of FIG. 1.

The actuator 110 is attached to the initial shape forming substrate 120 through the adhesive layer 101 arranged between them, and has a structure in which an electro-active polymer layer 113 is interposed between first and second electrodes 111 and 112 that face each other as shown in FIG. 4A. The actuator 110 is driven by a principle in which a bending force is exerted since the electro-active polymer layer 113 extends according to a voltage that is applied to the first and second electrodes 111 and 112.

Figure 4B:
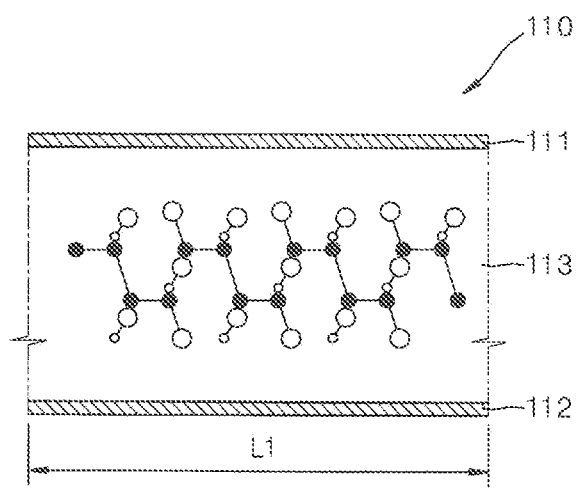
FIGS. 4B and 4C illustrate states of the actuator shown in FIG. 4A before and after the actuator is driven.
Figure 4C:
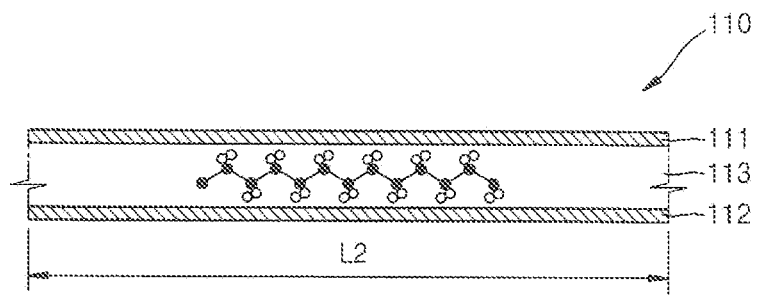

FIGS. 4B and 4C are diagrams related to the principles of driving the actuator 110. First, as illustrated in FIG. 4B, when a current does not flow, the electro-active polymer layer 113 maintains its initial thickness and length L1. At this state, when the voltage is applied to the first and second electrodes 111 and 112, as illustrated in FIG. 4C, the length L2 of the electro-active polymer layer 113 extends. In other words, the length L2 shown in FIG. 4C is larger than the length L1 shown in FIG. 4B. Here, since the surface of the actuator 110 is attached to and thus is restrained by the initial shape forming substrate 120, the other surface of the actuator 110 further extends, so that the bending force is exerted. On the other hand, when the voltage that is applied to the first and second electrodes 111 and 112 is removed, the electro-active polymer layer 113 returns to the state of FIG. 4B before the bending force is exerted. Here, since the initial state by the initial shape forming substrate 120 is the U-shape folding state, a state before the application of the voltage as shown in FIG. 4B is the folding state, and a state after the application of the voltage as shown in FIG. 4C is a flat state (or un-folded state).

Figure 3:
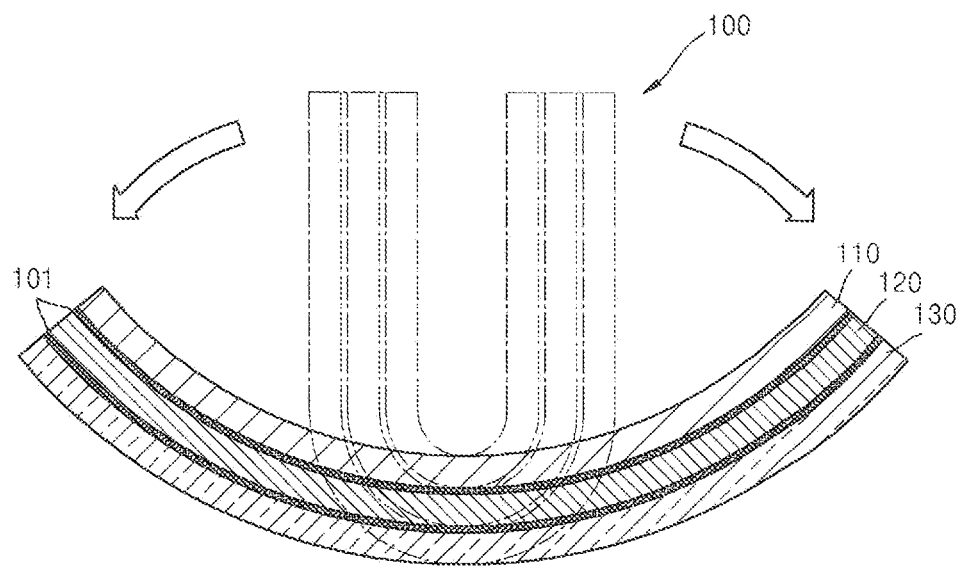
FIG. 3 illustrates a procedure of driving the flexible display device of FIG. 1.

FIG. 3 illustrates a driving state in which the bending force of the actuator 110 is exerted. In this regard, while the flexible display device 100 maintains its U-shape folding state by the initial shape forming substrate 120, when the actuator 110 is driven, the bending force is exerted so that the flexible display device 100 is unfolded into the flat state.

Due to the bending force, when the actuator 110 is driven, the display body 130 that is combined with the actuator 110 is also unfolded. On the other hand, when the voltage applied to the actuator 110 is removed, the flexible display device 100 returns to the U-shape folding state that is initially set by the initial shape forming substrate 120.

The electro-active polymer layer 113 may be formed of a material including polyvinylidene fluoride (PVDF), polydimethyl siloxane (PDMS), or polyvinylidene fluoride-co-trifluoroethylene (PVFT), and the first and second electrodes 111 and 112 may be formed of an indium tin oxide (ITO) material having flexibility. Obviously, it is possible to use any material capable of deriving the bending force in a manner that a length of the material interposed between the first and second electrodes 111 and 112 is extended due to the voltage applied to the first and second electrodes 111 and 112.

The flexible display device 100 may be used as follows:

First, when the flexible display device 100 is not used, the flexible display device 100 maintains its folding state by the initial shape forming substrate 120 as shown in FIG. 2. Here, since a voltage is not applied to the actuator 110, no power is used, and thus the flexible display device 100 is carried or is placed. Since a length of the flexible display device 100 in the folding state is decreased by half, it is very convenient to carry and place the flexible display device 100. As described above, since the voltage is not applied to the actuator 110 (referring to FIG. 4B), useless power consumption does not occur while the flexible display device 100 is carried or is placed.

In order to use the flexible display device 100, the voltage is applied to the first and second electrodes 111 and 112 of the actuator 110. Then, the electro-active polymer layer 113 extends (referring to FIG. 4C), so that the flexible display device 100 is unfolded (referring to FIG. 3) and then is finally turned into a flat state (referring to FIG. 1.). Thus, when the display body 130 at the flat state is driven, a user may watch images on a flat screen of the display body 130.

Afterward, when a use of the flexible display device 100 is ended, the voltage that is applied to the actuator 110 is removed, so that the flexible display device 100 returns to the folding state that is set by the initial shape forming substrate 120.

As described above, since the folding state and the flat state are controlled by driving the actuator 110, it is very exact and convenient to fold and carry the flexible display device 100 and then to flatly unfold the flexible display device 100 for use. Thus, by using the flexible display device 100, both portability and user convenience may be improved.

Also, since power is not consumed in the actuator 110 in a folding state of non-use state, but is only consumed in a use-state, useless power consumption does not occur.

Figure 5:
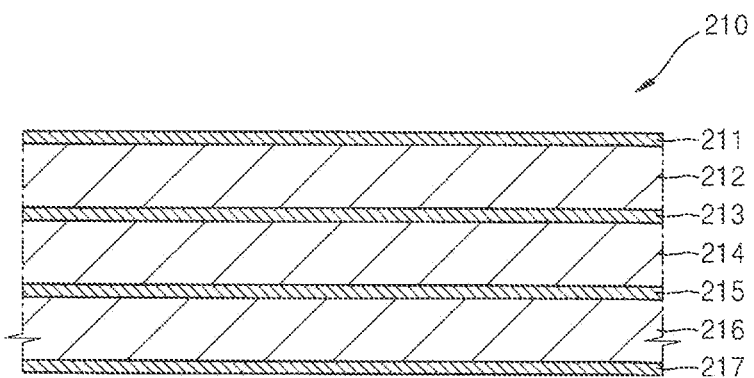
FIGS. 5 and 6 illustrate flexible display devices having amended structures of the flexible display device of FIG. 1, according to embodiments of the present invention.

In the embodiment of FIG. 1, the actuator 110 has a structure in which the electro-active polymer layer 113 is interposed between the first and second electrodes 111 and 112. However, as in another embodiment of FIG. 5, an actuator 210 may have a multi-layer structure in which electro-active polymer layers 212, 214, and 216 are interposed between electrodes 211, 213, 215, and 217, respectively, i.e., a plurality of units are stacked while forming multiple layers. When the actuator 210 has the multi-layer structure, a bending force may be increased.

Figure 6:
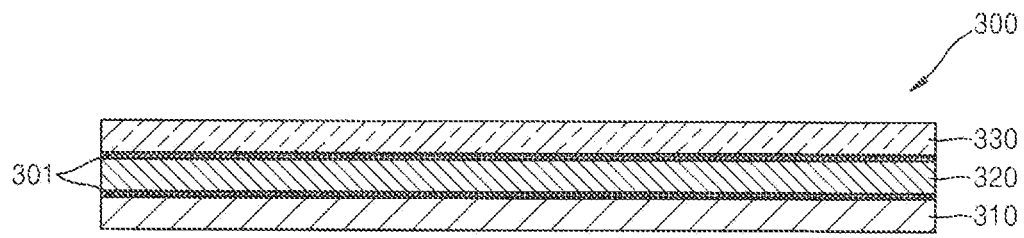

Also, in the embodiment of FIG. 1, the flexible display device 100 has the structure in which the display body 130 is attached to the surface of the initial shape forming substrate 120, and the actuator 110 is attached to the other surface of the initial shape forming substrate 120. However, as in another embodiment of FIG. 6, a flexible display device 300 may have a structure in which a display body 330 is attached to a surface of an actuator 320, and an initial shape forming substrate 310 is attached to a surface of the actuator 320. In this case, since the surfaces of the actuator 320 are attached to and thus are restrained by the display body 330 and the initial shape forming substrate 310, respectively, a bending force may be decreased. However, if adherence varies on the surfaces, an appropriate bending force may be achieved.

As described above, according to the one or more embodiments of the present invention, when a user carries a flexible display device according to an embodiment of the present invention, the flexible display device maintains a folding state without power consumption, and then when the user uses the flexible display device, the flexible display device drives an actuator so that the user may unfold the flexible display device and may watch a flat screen. Accordingly, the flexible display device may be used with minimum power consumption, improved portability, and improved user convenience.

Also, the flexible display device allows a user to exactly control a change state of the flexible display device by driving the actuator and to decrease power consumption for changing and driving the flexible display device. Thus, by using the flexible display device, user convenience can be improved and the flexible display device can be driven with low power consumption.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flexible display device comprising:
   a display body having flexibility;
   an actuator for changing and driving the display body; and
   an initial shape forming substrate for maintaining an initial state of the display body before the display body is changed and driven, wherein the initial shape forming substrate maintains the initial state of the display body as a folding state, and when the actuator is driven, the display body is turned into a flat state.

2. The flexible display device of claim 1, wherein the actuator comprises a first electrode and a second electrode which face each other, and an electro-active polymer layer that is interposed between the first electrode and the second electrode.

3. The flexible display device of claim 2, wherein, when a voltage is applied to the first electrode and the second electrode, the electro-active polymer layer extends whereby the flexible display device is changed.

4. The flexible display device of claim 2, wherein the electro-active polymer layer comprises a material selected from the group consisting of polyvinylidene fluoride (PVDF), polydimethyl siloxane (PDMS), polyvinylidene fluoride-co-trifluoroethylene (PVFT), and combinations thereof.

5. The flexible display device of claim 2, wherein the first electrode and the second electrode comprise an indium tin oxide (ITO) material.

6. The flexible display device of claim 2, wherein the actuator is formed of one basic unit in which the electro-active polymer layer is interposed between the first electrode and the second electrode.

7. The flexible display device of claim 2, wherein the actuator has a structure in which a plurality of basic units are stacked, and wherein the electro-active polymer layer is interposed between the first electrode and the second electrode in each of the plurality of the basic units.

8. The flexible display device of claim 1, wherein the initial shape forming substrate is formed of an alloy material comprising at least one selected from the group consisting of magnesium, aluminum, lead, and combinations thereof.

9. The flexible display device of claim 1, wherein the display body is attached to a surface of the initial shape forming substrate, and the actuator is attached to another surface of the initial shape forming substrate.

10. The flexible display device of claim 1, wherein the display body is attached to a surface of the actuator, and the initial shape forming substrate is attached to another surface of the actuator.

* * * * *